United States Patent
Alriksson et al.

(10) Patent No.: US 11,239,871 B2
(45) Date of Patent: *Feb. 1, 2022

(54) OPTIMIZATION OF AUTOMATIC GAIN CONTROL FOR NARROW BANDWIDTH OPERATION

(71) Applicant: Telefonaktiebolaget LM Ericsson (publ), Stockholm (SE)

(72) Inventors: Peter Alriksson, Horby (SE); Joakim Axmon, Limhamn (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 523 days.

This patent is subject to a terminal disclaimer.

(21) Appl. No.: 15/567,074

(22) PCT Filed: Apr. 11, 2016

(86) PCT No.: PCT/EP2016/057872
§ 371 (c)(1),
(2) Date: Oct. 16, 2017

(87) PCT Pub. No.: WO2016/166039
PCT Pub. Date: Oct. 20, 2016

(65) Prior Publication Data
US 2018/0102803 A1 Apr. 12, 2018

Related U.S. Application Data

(63) Continuation of application No. 14/825,141, filed on Aug. 12, 2015, now Pat. No. 9,716,521.
(Continued)

(51) Int. Cl.
*H04B 1/12* (2006.01)
*H04W 52/52* (2009.01)
*H03G 3/30* (2006.01)

(52) U.S. Cl.
CPC .......... *H04B 1/123* (2013.01); *H03G 3/3078* (2013.01); *H04W 52/52* (2013.01); *H03G 2201/103* (2013.01); *H03G 2201/702* (2013.01)

(58) Field of Classification Search
CPC ................. H04B 1/123; H03G 3/3078; H03G 2201/103; H03G 2201/702; H04W 52/52
See application file for complete search history.

(56) References Cited

U.S. PATENT DOCUMENTS 4,955,078 A * 9/1990 Chung .................. H03D 3/008
455/234.1
6,078,798 A 6/2000 Kobayashi
(Continued)

FOREIGN PATENT DOCUMENTS

| CN | 100385995 C | 3/2006 |
|---|---|---|
| CN | 101340526 A | 1/2009 |

(Continued)

OTHER PUBLICATIONS

Russian Office Action, dated Sep. 26, 2018, in connection with Russian Application No. 2017139927, 6 pages.
(Continued)

*Primary Examiner* — Michelle M Koeth
(74) *Attorney, Agent, or Firm* — Leffler Intellectual Property Law, PLLC; Kenneth B. Leffler

(57) ABSTRACT

The gain of an amplifier in a receiver operating in a cellular communication system is controlled by determining one or more gain variability metrics, which are then used to produce first and second threshold values. A frequency difference between a current carrier frequency and a target carrier frequency is ascertained and then compared to the threshold values. Target gain setting production is based on comparison results: If the frequency difference is larger than the first threshold, a first automatic gain control algorithm is per- (Continued)

formed; if the frequency difference is smaller than the first threshold and larger than the second threshold, a second automatic gain control algorithm is performed, wherein the second automatic gain control algorithm uses a current gain setting as a starting point; and if the frequency difference is smaller than both the first and second thresholds, the current gain setting is used as the target gain setting.

4 Claims, 7 Drawing Sheets

Related U.S. Application Data

(60) Provisional application No. 62/148,952, filed on Apr. 17, 2015.

(56) References Cited

U.S. PATENT DOCUMENTS

| | | | |
|---|---|---|---|
| 6,563,891 B1 | 5/2003 | Eriksson et al. | |
| 9,716,521 B2 * | 7/2017 | Alriksson | H03G 3/3078 |
| 2004/0087292 A1 | 5/2004 | Shiu et al. | |
| 2010/0074371 A1 | 3/2010 | West | |
| 2010/0248665 A1 * | 9/2010 | Jonsson | H03G 3/3068 |
| | | | 455/140 |
| 2011/0129045 A1 * | 6/2011 | Tseng | H04L 27/0014 |
| | | | 375/344 |
| 2012/0020388 A1 | 1/2012 | Yokoshima | |
| 2012/0129480 A1 * | 5/2012 | Ruelke | H04B 1/001 |
| | | | 455/296 |
| 2013/0003584 A1 * | 1/2013 | Alriksson | H03G 3/3052 |
| | | | 370/252 |
| 2016/0135056 A1 * | 5/2016 | Wu | H04W 16/14 |
| | | | 370/252 |

FOREIGN PATENT DOCUMENTS

| | | | |
|---|---|---|---|
| CN | 102907145 A | | 1/2013 |
| EP | 1583232 A2 * | 10/2005 | H03G 3/3068 |
| EP | 1583232 A2 | 10/2005 | |
| EP | 2367385 B1 | 9/2011 | |
| EP | 2512044 A1 | 10/2012 | |
| GB | 521559 A | 5/1940 | |
| RU | 2241304 C2 | 11/2004 | |
| WO | 2007134201 A2 | 11/2007 | |
| WO | 2012171542 A1 | 12/2012 | |

OTHER PUBLICATIONS

English translation of Russian Office Action, dated Sep. 26, 2018, in connection with Russian Application No. 2017139927, 2 pages.
PCT International Search Report, dated Jul. 4, 2016, in connection with International Application No. PCT/EP2016/057872, all pages.
PCT Written Opinion, dated Jul. 4, 2016, in connection with International Application No. PCT/EP2016/057872, all pages.
3GPP TSG RAN Meeting #67, Revised WI: Further LTE Physical Layer Enhancements for MTC, Shanghai, China, Mar. 9-12, 2015, pp. 1-9.
3GPP TSG RAN WG4 Meeting #74bis, RRM measurements under enhanced coverage for MTC, Rio de Janeiro, Brazil, Apr. 20-24, 2015, pp. 1-12.
Non-Final Office Action dated Jun. 30, 2016 in connection with U.S. Appl. No. 14/825,141, 19 pages.
Final Office Action dated Nov. 16, 2016 in connection with U.S. Appl. No. 14/825,141, 23 pages.
Notice of Allowance dated Mar. 22, 2017 in connection with U.S. Appl. No. 14/825,141, 14 pages.
Chinese Office Action dated Nov. 5, 2019 in connection with Chinese Application No. 201680022492.1, 6 pages.
English language summary of Chinese Office Action dated Nov. 5, 2019 in connection with Chinese Application No. 201680022492.1, 2 pages.
Chinese Search Report dated Oct. 28, 2019 in connection with Chinese Application No. 201680022492.1, 2 pages.
Chinese Office Action dated Jun. 5, 2020 in connection with Chinese Application No. 201680022492.1, 5 pages.
English language summary of Chinese Office Action dated Jun. 5, 2020 in connection with Chinese Application No. 201680022492.1, 1 page.

* cited by examiner

OPTIMIZATION OF AUTOMATIC GAIN CONTROL FOR NARROW BANDWIDTH OPERATION

CROSS-REFERENCE TO RELATED APPLICATIONS

This application is a § 371 national stage of PCT/EP2016/057872, filed Apr. 11, 2016, which claims the benefit of U.S. Provisional Application No. 62/148,952, filed Apr. 17, 2015, and which also claims the benefit of U.S. application Ser. No. 14/825,141, filed Aug. 12, 2015 (issued on Jul. 25, 2017 as U.S. Pat. No. 9,716,521) which applications are all hereby incorporated herein by reference in their entireties.

BACKGROUND

The present invention relates to Automatic Gain Control (AGC) in a radio receiver, and more particularly technology that optimizes AGC in scenarios in which only a portion of a full transmission bandwidth is received at a time.

One of the most important properties of a hand held device is its battery life. For a User Equipment (UE) in a mobile communication system, the dominating power consumer is the radio. In some cases, a UE's radio circuitry can be responsible for more than 50% of the total power consumption. Thus, minimizing the amount of time the radio needs to be active is crucial for extending the UE battery life.

Due to the limited dynamic range of the receiver, the UE needs to adjust the gain prior to reception. An AGC algorithm, responsible for this adjustment, typically starts by setting one or more amplifiers to operate at some initial gain value. The power of the received signal is then measured, and the gain is adjusted accordingly. This procedure is then repeated until a good gain value has been found. If a good initial guess is available, the algorithm typically requires less radio time to converge. Because the gain has to be corrected prior to reception of useful data, one must know how long the AGC algorithm needs to achieve convergence so that reception can be started at the correct time. Thus, to be able to reduce the additional time needed prior to reception, one must know a priori that an optimized algorithm can be used; otherwise, the worst-case time to convergence must be assumed. In some situations it might even be possible to use a gain value from a previous run of the AGC algorithm.

AGC algorithms generally consist of three steps: power measurement, gain computation, and actuation. The purpose of the power measurement step is to estimate the received power of the signal. In the gain computation step, a suitable gain value is determined; and in the actuation step, this gain value is applied to the receiver chain.

To be able to make a reliable estimate, the signal on which the estimate is based needs to be representative of the signal one wants to receive. For example in the case of Evolved Universal Terrestrial Radio Access (E-UTRA), some subframes might be allocated to Multimedia Broadcast over Single Frequency Network (MBSFN) transmissions, or in the case of Time Division Duplex (TDD) mode, might be allocated for uplink transmission. In each of these examples, these subframes are not representative of the wanted signal and thus are not suitable for power measurements. For example, MBSFN subframes might be used by the Evolved NodeB (eNB) for power saving purposes and thus contain no or at least very little power compared to subframes allocated for regular downlink transmissions. Even if all cells are not synchronized in time, the received power might be dominated by a nearby eNB. Thus the received power during MBSFN subframes might be very low compared to regular subframes. It will further be recognized that sub-frames allocated for uplink transmission cannot be used to estimate the power of downlink subframes. Thus, the UE must limit power measurements to certain suitable time intervals. This is has the unwanted effect that the AGC procedure can be quite time consuming.

FIGS. 1 and 2 illustrate the limited time available for making suitable power measurements for the cases of Frequency Division Duplex (FDD) and TDD operation, respectively. In the figures, in addition to abbreviations already introduced, the following abbreviations are used:

P-SCH: Primary Synchronization Channel
S-SCH: Secondary Synchronization Channel
TX: transmission
GP: Guard Period
UL: uplink More particularly, FIG. 1 depicts synchronization signals and reference symbols transmitted in an FDD cell. Only the central 72 sub-carriers are shown. Some sub-frames may be used for MBSFN, to take one example, and hence might not contain cell-specific reference symbols other than in the first symbol.

FIG. 2 depicts synchronization signals and reference symbols transmitted in a TDD cell. Only the central 72 sub-carriers are shown. Some sub-frames may be used for UL transmissions and hence might not contain cell-specific reference symbols, while others may be used for downlink (DL) transmissions but used for MBSFN transmissions, and hence contain reference signals only in the first symbol.

During the actuation phase of the typical AGC algorithm, the gain value is typically changed in multiple places through the receiver chain. These changes impair the received signal with, for example DC-transients and phase discontinuities. Thus gain changes should be limited to moments in time at which the impact of these impairments will be limited (i.e., they will not degrade reception of data). In the case of E-UTRA channel reception, these changes can for example be limited to occur at slot or subframe borders.

A measure of the frequency channel variations is the so called coherence bandwidth, $B_c \approx 1/\tau_{max}$ where $\tau_{max}$ is the maximum delay spread (difference between the first and last significant tap in the impulse response). The coherence bandwidth for the three typical channel profiles (i.e., Extended Pedestrian A (EPA), Extended Vehicular A (EVA) and Extended Typical Urban (ETU)) used in 3GPP are 2.44 MHz, 0.40 MHz and 0.2 MHz. Exemplary frequency responses for these three channels are illustrated in respective FIGS. 3a, 3b, and 3c for the case of a 20 MHz cell in good coverage conditions.

As a comparison, FIG. 4 illustrates the frequency response for a 3GPP ETU channel for a 20 MHz cell in low coverage conditions (−10 dB SNR).

Conventional receiver equipment applies a "better safe than sorry" approach with respect to AGC. That is, the AGC is always scheduled to run, regardless of whether it is really needed. This conservative approach results in unnecessarily high power consumption under some circumstances.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

Moreover, reference letters are provided in some instances (e.g., in the claims and summary) to facilitate identification of various steps and/or elements. However, the use of reference letters is not intended to impute or suggest that the so-referenced steps and/or elements are to be performed or operated in any particular order.

In accordance with one aspect of the present invention, the foregoing and other objects are achieved in technology for controlling gain of an amplifier in a receiver operating in a cellular communication system. Gain control includes ascertaining a frequency difference between a current carrier frequency and a target carrier frequency and comparing the frequency difference to a first threshold value. In response to satisfaction of first criteria that include the frequency difference being larger than the first threshold value, a full automatic gain control algorithm is performed to produce a target gain setting. In response to satisfaction of second criteria that include the frequency difference being smaller than the first threshold, an optimized automatic gain control algorithm is performed to produce the target gain setting. The target gain setting is then used to control gain of the amplifier.

In an aspect of some but not necessarily all embodiments, the second criteria further include the frequency difference being larger than a second threshold value.

In an aspect of some but not necessarily all embodiments, gain control comprises using one or more gain variability metrics to produce the second criteria.

In an aspect of some but not necessarily all embodiments, gain control further comprises using the current gain setting as the target gain setting in response to satisfaction of third criteria that include the frequency difference being smaller than both the first and second thresholds.

In an aspect of some but not necessarily all embodiments, the optimized automatic gain control algorithm uses a current gain setting as a starting point.

In an aspect of some but not necessarily all embodiments, gain control comprises determining one or more gain variability metrics.

In an aspect of some but not necessarily all embodiments, determining one or more gain variability metrics comprises one or more of:
  determining a current degree of coverage of the receiver;
  determining whether the current carrier frequency and the target carrier frequency are within a downlink system bandwidth of a same cell of the cellular communication system;
  determining whether a source cell and a target cell are associated with each other, wherein the source cell is transmitting on the current carrier frequency and the target cell is transmitting on the target carrier frequency; and
  determining propagation conditions of a signal reaching the receiver.

In an aspect of some but not necessarily all embodiments, gain control comprises using one or more gain variability metrics to produce the first criteria.

In an aspect of some but not necessarily all embodiments, using the one or more gain variability metrics to produce the first criteria comprises using a channel model and the one or more gain variability metrics to produce the first criteria.

In an aspect of some but not necessarily all embodiments, using the one or more gain variability metrics to produce the first criteria comprises using static information and the one or more gain variability metrics to produce the first criteria.

In an aspect of some but not necessarily all embodiments, using the one or more gain variability metrics to produce the first criteria comprises ascertaining whether historical gain variability data is available; and in response to historical gain variability data being available, using the historical gain variability data and the one or more gain variability metrics to produce the first criteria.

In an aspect of some but not necessarily all embodiments, gain control comprises updating a database of historical gain variability data based on one or more gain variability metrics.

In an aspect of some but not necessarily all embodiments, the database of historical gain variability data provides information indicating what gain values have been used in the past when receiving data at one or more particular frequencies.

BRIEF DESCRIPTION OF THE DRAWINGS

The objects and advantages of the invention will be understood by reading the following detailed description in conjunction with the drawings in which.

DETAILED DESCRIPTION

Figure 1:
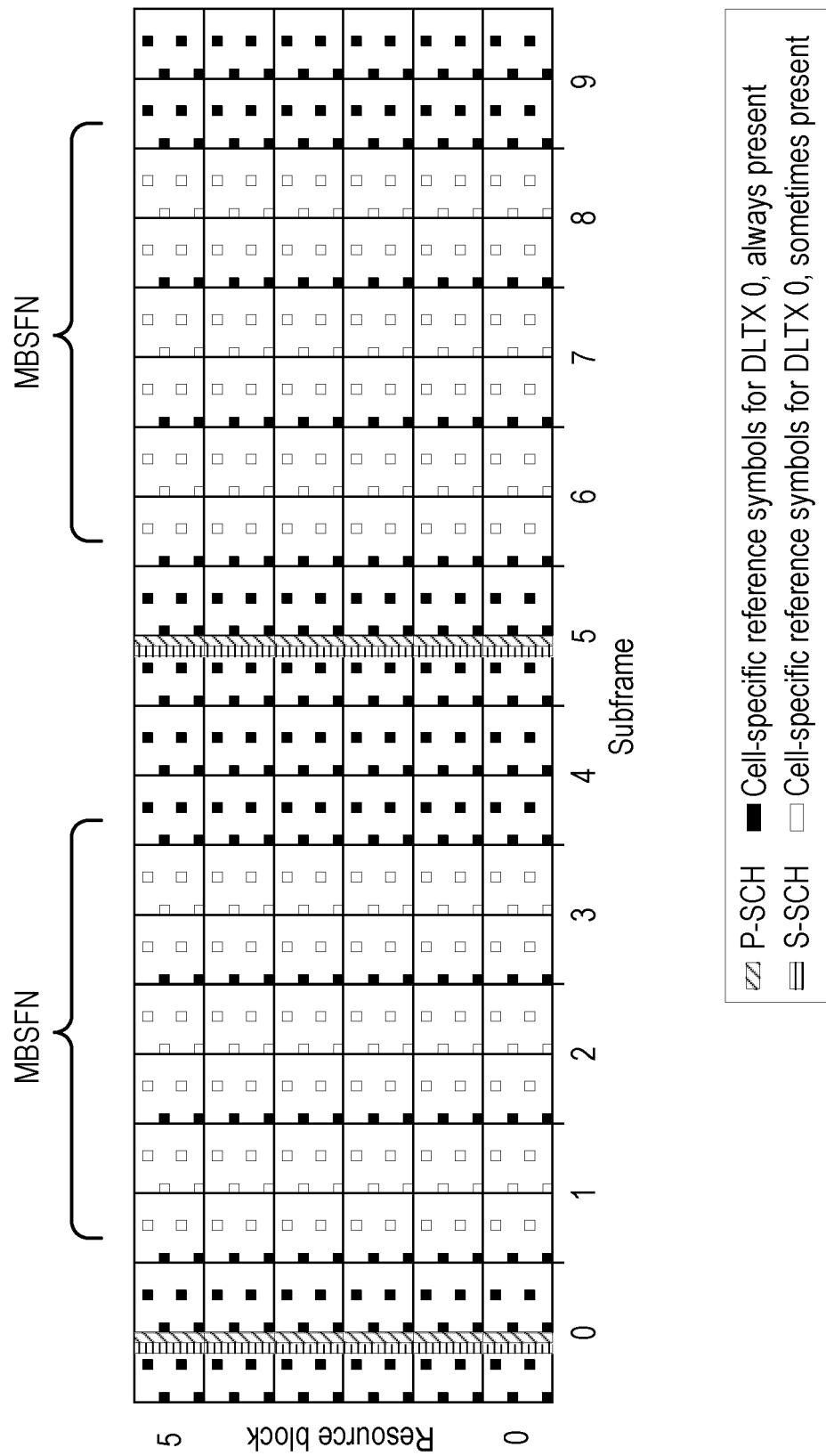
FIG. 1 depicts synchronization signals and reference symbols transmitted in an FDD cell.
Figure 2:
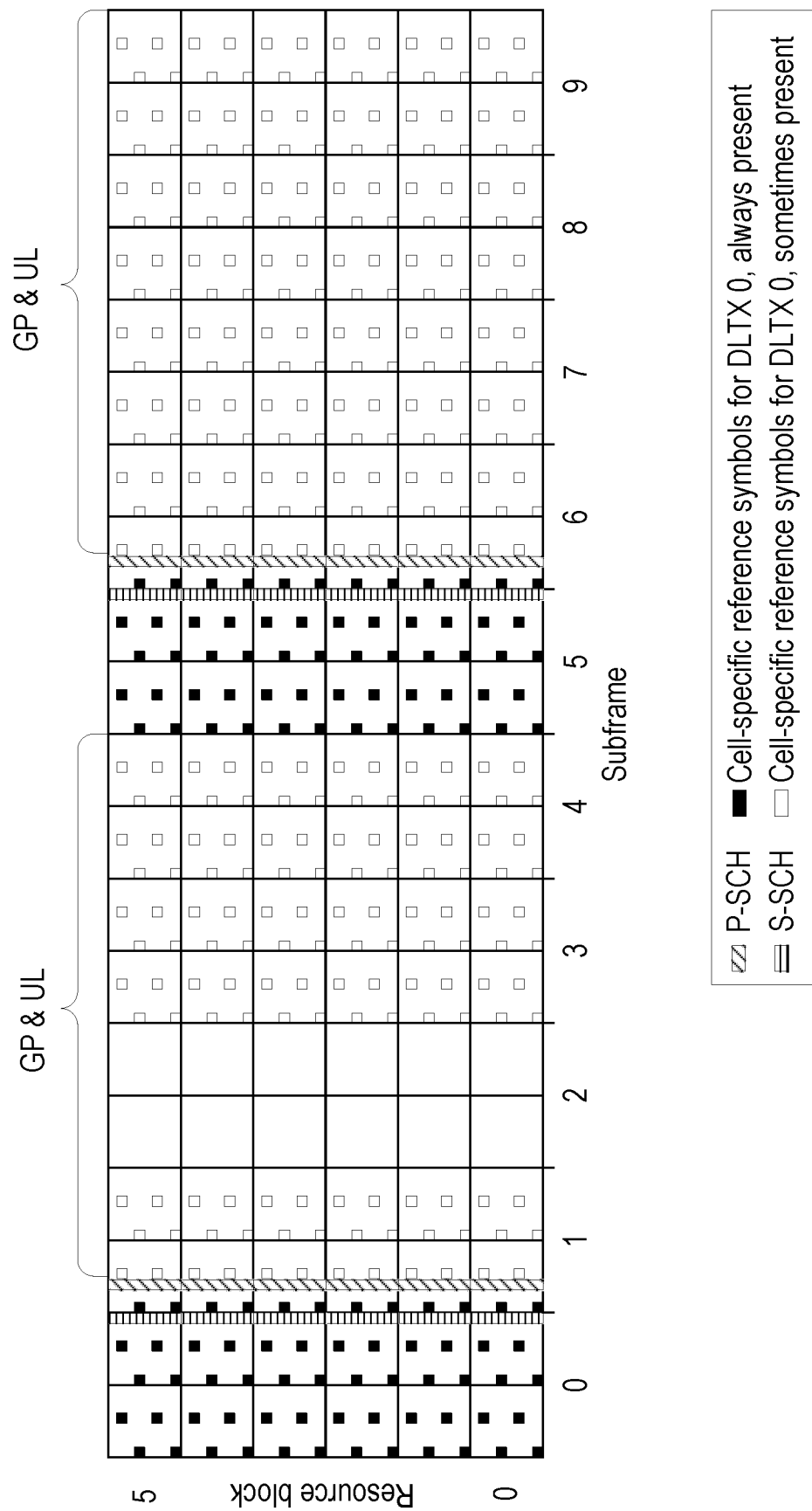
FIG. 2 depicts synchronization signals and reference symbols transmitted in a TDD cell.
Figure 3A:
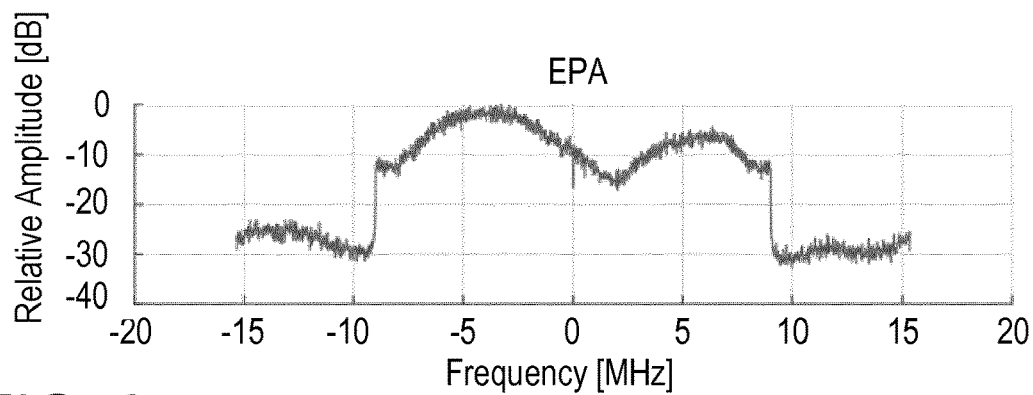
FIGS. 3a, 3b, and 3c depict exemplary frequency responses for three types of channels for the case of a 20 MHz cell in good coverage conditions.
Figure 3B:
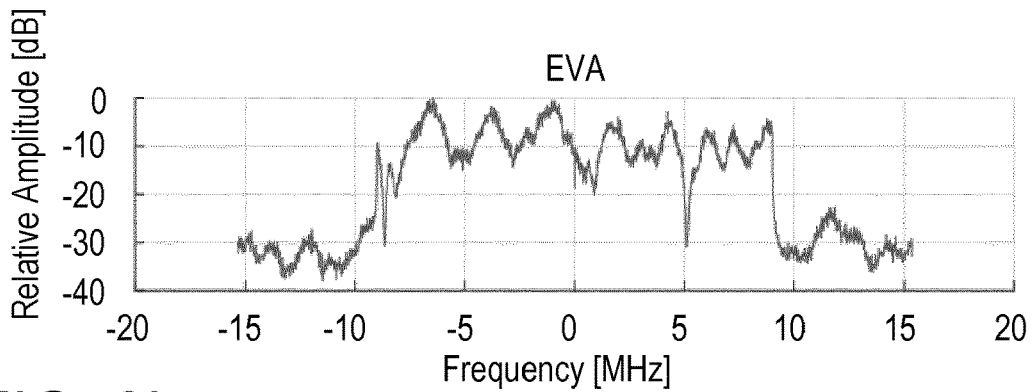
Figure 3C:
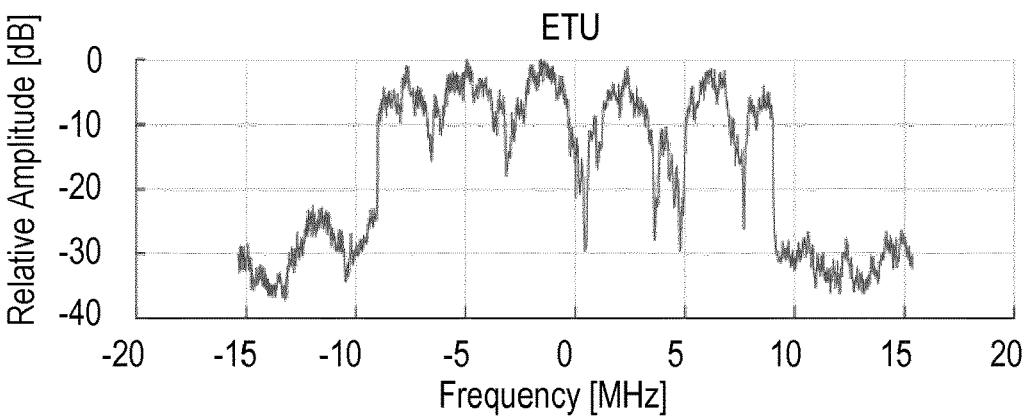
Figure 4:
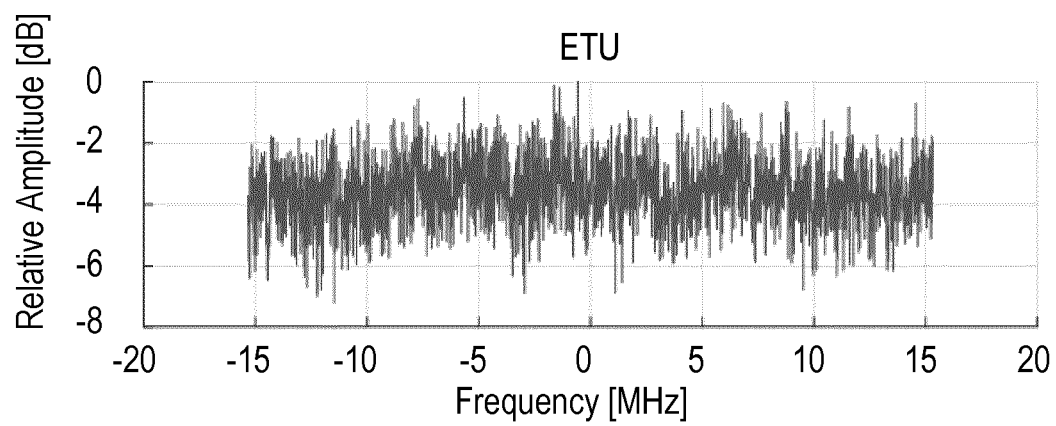
FIG. 4 illustrates the frequency response for a 3GPP ETU channel for a 20 MHz cell in low coverage conditions (−10 dB SNR).

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system or other hardware capable of executing programmed instructions. It will be recognized that in each of the embodiments, the various actions could be performed by specialized circuits (e.g., analog and/or discrete logic gates interconnected to perform a specialized function), by one or more processors programmed with a suitable set of instructions, or by a combination of both. The term "circuitry configured to" perform one or more described actions is used herein to refer to any such embodiment (i.e., one or more specialized circuits alone or in combination with one or more programmed processors). Moreover, the invention can additionally be considered to be embodied entirely within any form of nontransitory computer readable carrier, such as solid-state memory, magnetic disk, or optical disk containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments as described above may be referred to herein as "logic configured to" perform a described action, or alternatively as "logic that" performs a described action.

To illustrate various aspects of the inventive technology, parts of this description take as their main focus, scenarios in which a Machine Type Communication (MTC) device operates within a given cell bandwidth but tunes its receiver to only parts of the transmission bandwidth at any given time, and thus needs to retune its receiver to receive other parts of the transmission bandwidth of the cell. Thus the carrier frequency is only slightly changed between receptions. This is different compared to cases in which inter-frequency measurements (potentially on a different band) need to be performed.

Notwithstanding this focus, the invention is not limited to use only in MTC devices, but is usable under any circumstances in which its application would prove beneficial.

In one aspect, embodiments consistent with the invention take advantage of the fact that, if the carrier frequency is changed only slightly and within the DL system bandwidth of the cell hosting the device, the AGC procedure can be optimized. The optimized procedure can be done in steps, with the degree of optimization being determined based on the distance between the current and target carrier frequencies and/or the degree of coverage.

These and other aspects will now be described in further detail.

In one aspect of embodiments consistent with the invention, an AGC scheduler implements an algorithm for selecting which of a number of AGC methods to use at any given time, with selection being based on one or more of the following:

whether a gain setting for the current carrier frequency (i.e., the one the receiver is presently tuned to) exists the distance in frequency between the current carrier frequency and the carrier frequency to which the receiver is to be tuned the degree of coverage at the current carrier frequency (e.g., in terms of signal-to-noise ratio (SNR), signal-to-interference ratio (SIR), and/or signal-to-interference plus noise ratio (SINR) levels, which are indicative of whether the device is operating in so-called enhanced coverage or normal coverage, as these terms are known in the art of mobile communications). If the device's degree of coverage is enhanced coverage, thermal noise from the low-noise amplifier in the receiver dominates over sources of interference (e.g., from neighboring cells). Under these conditions, the same gain setting as is presently being used can be assumed to apply to operation at the target frequency as long as the device (e.g., MTC device) is operating within the cell bandwidth of the serving cell. This is in contrast to scenarios that, in general, are interference-limited, whereby the gain setting for use at the target frequency very much depends on whether the serving (and intra-frequency neighbor) cells are empty or fully loaded in the concerned subframe.

whether the source (current) and the target carrier frequencies are within the DL system bandwidth of the same cell, for example, a cell serving UEs over a wide bandwidth and also MTC devices in narrow subbands whether the source and target cells are associated with each other; for example, collocated cells operating in intra-band contiguous Carrier Aggregation (CA) (Primary Cell—PCell—and one or more Secondary Cells—SCells) for UEs supporting the feature, and for which a fixed power offset can be assumed, or other collocated cells, for example, operating on one carrier frequency for broadcast and multicast and another carrier for unicast the expected amount of channel variability with respect to frequency and degree of coverage based on previous receptions or other a priori information Another aspect of some embodiments consistent with the invention is the use of a Variability Database that stores historical data regarding gain differences for different frequencies at different degree of coverage.

These and other aspects will now be described with reference to FIG. 5, which is, in one respect, a flow chart of steps/processes performed by circuitry in accordance with some but not necessarily all exemplary embodiments consistent with the invention. In another respect, FIG. 5 can be considered to depict exemplary means 500 comprising the various illustrated circuitry (e.g., hard-wired and/or suitably programmed processor) configured to perform the described functions.

Figure 5:
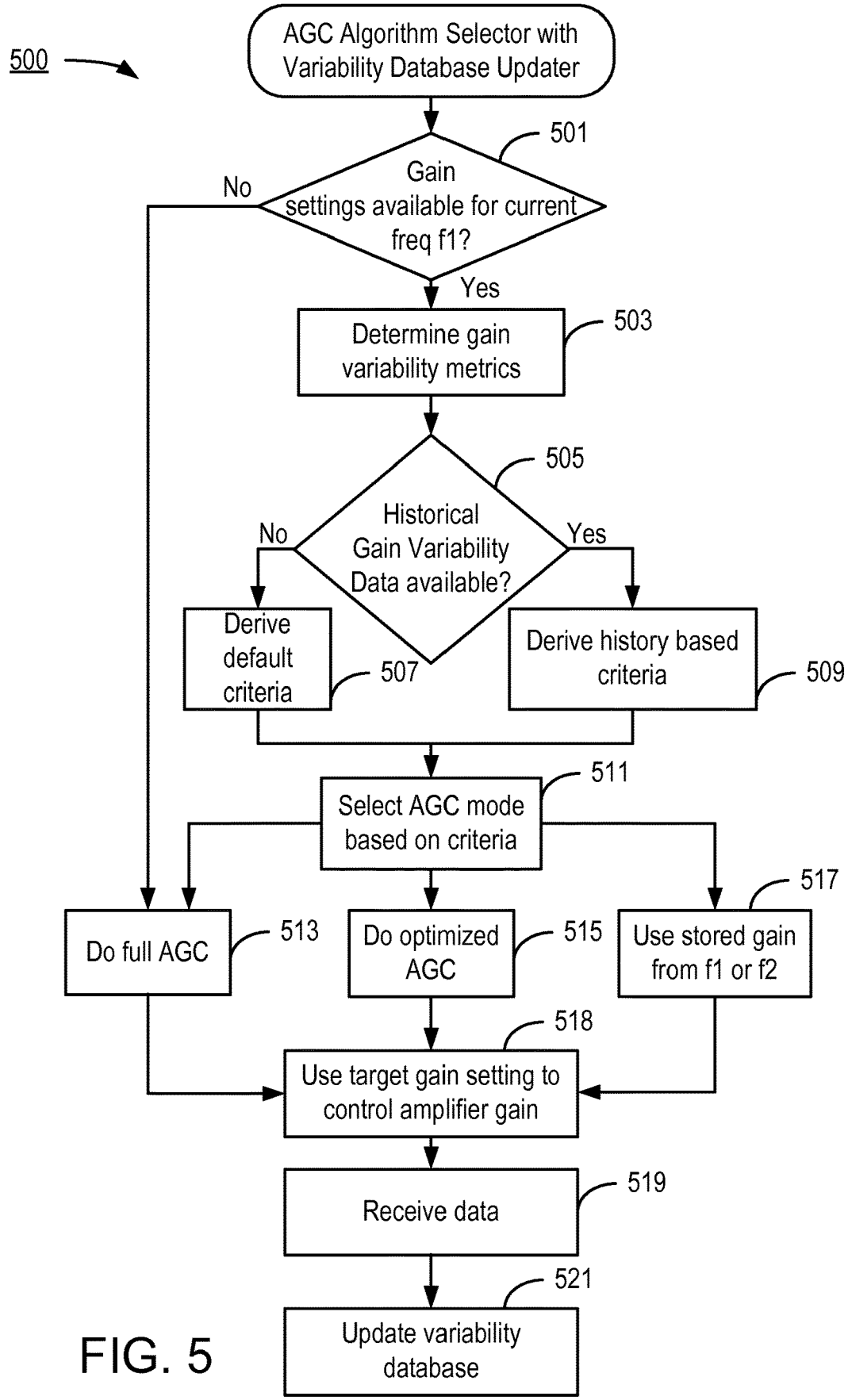
FIG. 5 is, in one respect, a flow chart of steps/processes performed by circuitry in accordance with some but not necessarily all exemplary embodiments consistent with the invention.

The functionality depicted in FIG. 5 is invoked when the device is requested to tune its receiver from a current frequency, f1, to a nearby frequency, f2. In one step, the circuitry ascertains whether there are existing gain settings for the current carrier frequency, f1 (decision block 501). If not ("No" path out of decision block 501), it is necessary to perform a full (i.e., non-optimized) AGC algorithm, so processing continues at step 513 for this purpose.

If there are existing gain settings for the current carrier frequency, f1 ("Yes" path out of decision block 501), then further processing determines whether these can be used as a basis for running an optimized AGC algorithm. As part of that further processing, one or more gain variability metrics are determined (step 503). Exemplary gain variability metrics include, but are not limited to, the following:

The magnitude of the frequency difference |f2−f1| (e.g., in Hz) between the current (source) frequency and new (target) frequency (f2)

The device's current degree of coverage. In some embodiments, this can be ascertained directly (e.g., from network signaling, which can be dedicated signaling directed to the device or alternatively broadcast to devices within a coverage area). Alternatively, the device's current degree of coverage can be ascertained indirectly. Indirect indicators of whether the device is operating in so-called enhanced coverage or normal coverage, as these terms are known in the art of mobile communications, include, but are not necessarily limited to: measured Reference Signal Received Power (RSRP), SNR, SIR, and/or SINR levels. Using these types of measures, the device can assess whether the wanted signal is well below the noise floor, which is an indicator that the device is in enhanced coverage conditions. If the wanted signal is well above the noise floor, the device is operating in normal coverage conditions, in which case channel variations must be taken into account.

Whether the source and the target carrier frequencies are within the DL system bandwidth of the same cell.

Whether the source and target cells are associated with each other. An exemplary association is the case of collocated cells having a fixed power offset with respect to one another.

Propagation conditions, where for example pronounced multipath propagation may be indicative of fading dips in particular parts of the spectrum.

Any one or combination of the above can be used to ascertain the extent to which current gain settings can be used either "as is" or at least as a starting point for determining gain settings for operation at the target carrier frequency.

Next, the device ascertains whether there is historical gain variability data available for the carrier frequencies f1 and f2 (decision block 505). The historical gain variability data is a record indicating the typical difference in gain that the device has used when receiving on the frequencies f1 and f2 in the past for different degrees of coverage.

If no such historical data is available ("No" path out of decision block 505), default (conservative) criteria (e.g., one or more threshold values) are derived based on typical channel models or other static, a priori information (step 507). But if historical gain variability data is available ("Yes" path out of decision block 505), then this is used to generate criteria (e.g., one or more threshold values) that are better tailored to the device's actual operating conditions (step 509).

Regardless of whether they are generated from default information or from historical data, the threshold values generated by steps 507 and 509 constitute thresholds that represent when one AGC mode should be used over another for a given difference between the frequencies f1 and f2. In this respect, the gain variability metrics determined in step 503 influence what thresholds will be generated in either of steps 507 and 509.

Figure 5A:
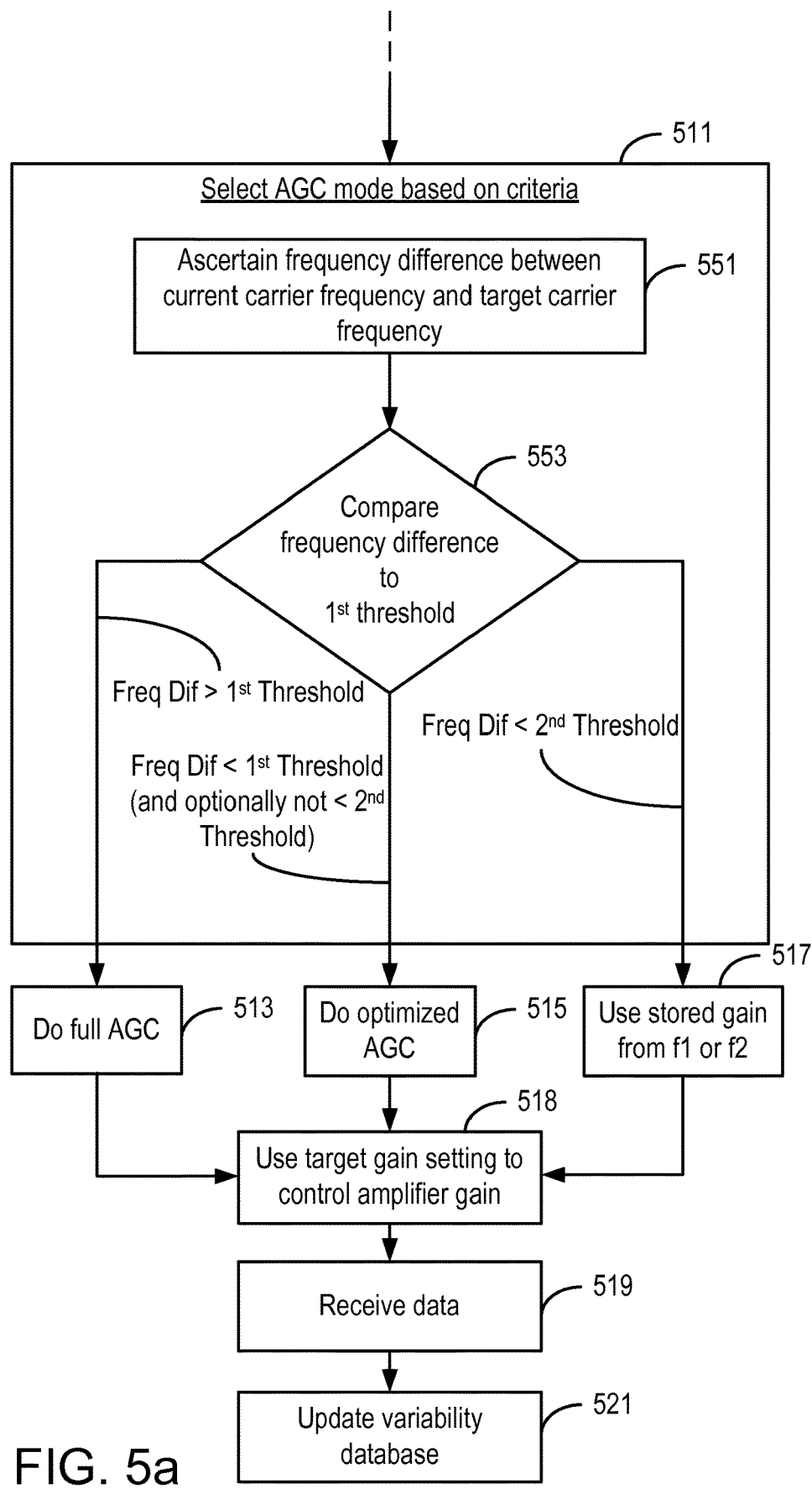
FIG. 5A is, in one respect, a flow chart illustrating one or more of the steps/processes/circuitry of FIG. 5 in more detail.

Next, the generated criteria (thresholds) are used as a basis for selecting how to generate gain settings for the device (step 511). More particularly, and as illustrated in greater detail in FIG. 5A, step 511 in at least some exemplary embodiments comprises ascertaining the frequency difference between the source (current) carrier frequency, f1, and the target carrier frequency, f2 (step 551). The ascertained frequency difference is then compared (step 553) with the criteria (thresholds) generated from one of the steps 507 and 509. If the frequency difference is larger than a first threshold, this means that the frequency difference is large compared to the channel variations; consequently, a robust AGC mode ("full AGC") that does not rely on any assumptions regarding the received power is used (step 513).

If, in the comparison illustrated by decision block 553, the frequency difference is smaller than the first coverage dependent threshold but is (at least in some embodiments) larger than a second threshold, then the frequency difference is deemed to be quite small compared to the channel variations. Consequently, an optimized AGC algorithm is used to derive gain values, with the optimization arising from the use of the existing gain settings for operation at frequency f1 as a starting point (step 515).

Still considering step 511, and more particularly the comparison illustrated by decision block 553, if the frequency difference is smaller than the second coverage dependent threshold, then the frequency difference is deemed to be small compared to the channel variations (i.e., small compared to the coherence bandwidth—the bandwidth over which the frequency characteristics of the channel can be approximated to be constant), then AGC is not used at all. Instead, the current (stored) gain settings for operation at frequency f1 are applied for use at the target frequency f2 (step 517).

Having generated gain settings by one of the steps 513, 515, and 517, they are applied to the receiver (i.e., to control amplifier gain as illustrated by step 518) and data reception begins (step 519), and the gain is updated continuously to track channel variations.

As this embodiment relies on historical gain variability data, it is advantageous to make that data as complete as possible. Thus, the gain variability data is updated for the frequencies f1 and f2 to improve future decisions.

The following examples illustrate how gain values can be generated in accordance with an exemplary embodiment consistent with the invention:

Example 1

Assume that Metrics={|f2−f1|=5 MHz, normal coverage}, and historical data exist for these metrics. Consequently, thresholds are generated based on historical data and an optimized AGC algorithm is performed.

Example 2

Assume that Metrics={|f2−f1|=5 MHz, normal coverage}, and no historical data exists for these metrics. Consequently, thresholds are generated based on a model, and a full AGC algorithm is performed.

Example 3

Assume that Metrics={|f2−f1|=5 MHz, extended coverage}, and historical data exist for these metrics. Consequently, thresholds are generated based on historical data, and the stored gain currently being used for reception at frequency f1 is applied for use at frequency f2 without performing any AGC algorithm.

Figure 6:
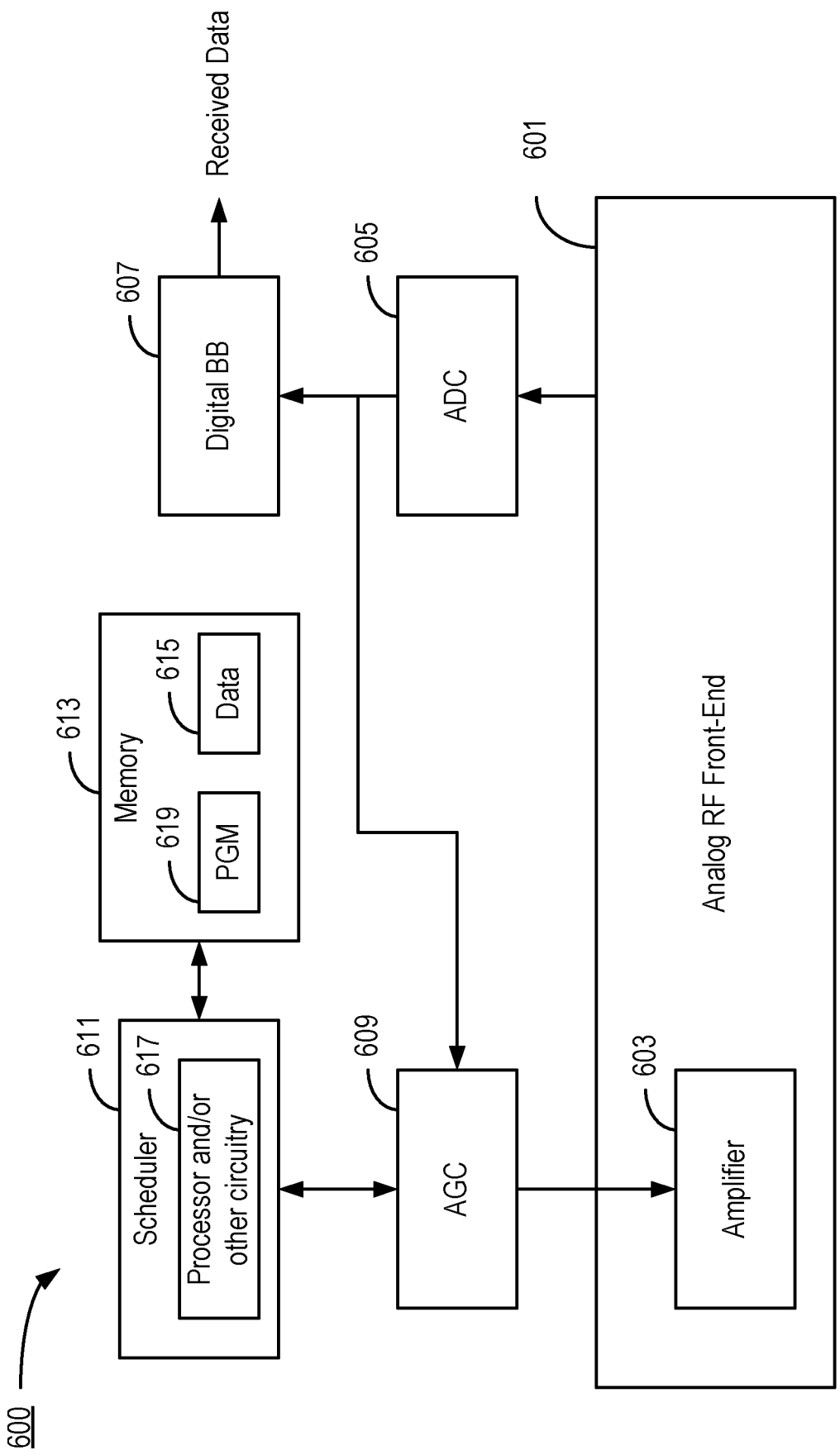
FIG. 6 is a block diagram of an exemplary embodiment of a device consistent with the invention.

FIG. 6 is a block diagram of an exemplary embodiment of a device 600 consistent with the invention. The device comprises an analog RF front-end 601, as is known in the art. The analog RF front-end 601 includes, among other circuitry, at least one amplifier, as illustrated in this example by the amplifier 603. The analog RF front-end 601 is tuned to a given carrier frequency, and receives a signal. The analog RF front-end outputs the received analog signal to an analog-to-digital converter (ADC) 605, which generates therefrom a digital form of the signal. The digital received signal is supplied to digital baseband (BB) circuitry 607, which processes the signal to receive therefrom the intended received data.

As described above, it is important for good data reception that the gain of the amplifier 603 be properly adjusted. For this purpose, the digital received signal supplied at the output of the ADC 605 is also supplied to AGC circuitry 609 which generates and supplies gain values to a gain control input of the amplifier 603. In an aspect of this embodiment, the AGC circuitry 609 is able to selectively perform any one of full and optimized AGC algorithms. Selective control of the AGC circuitry 609 is also able to make it not run any algorithm at all, and instead to simply pass along a current gain setting (being used for operation at a current/source carrier frequency) for use at a new, target carrier frequency. Although this last option has been described as an affirmative action performed by the AGC circuitry 609, it will be recognized that in some embodiments the AGC circuitry 609 need not actually do anything to bring about the desired result, since the amplifier 603 is already operating at the desired (current) gain setting.

Selective operation of the AGC 609 is controlled by a scheduler 611, which is configured to carry out methodology consistent with the principles described herein, such as with reference to FIG. 5. The scheduler 611 is therefore coupled to the AGC 609, thereby enabling the scheduler 611 to provide one or more control signals to the AGC 609, and also (in some embodiments), to receive information from the AGC 609, such as present gain setting information.

In this illustrated embodiment, the scheduler 611 is also coupled to a nontransitory memory 613, at least for storing and making available data 615, such as gain variability data as described earlier.

The scheduler 611 can be embodied in any number of forms, such as programmable alone or in combination with other circuitry 617. When programmable processor is used, the memory 613 can further store program data 619 configured to cause the processor to carry out AGC control operations, such as those described above with reference to FIG. 5.

In this illustrative embodiment, the memory 613 has been shown as an entity that is separate from the scheduler 611. However, this is not a requirement; in alternative embodiments, the scheduler 611 can, itself, include one or more memory devices.

To further illustrate aspects of embodiments consistent with the invention, an example will now be described that applies principles described above. Assume that a low-cost MTC device, capable of supporting a bandwidth spanning only 6 resource blocks (RBs) (i.e., 1.4 MHz), is hosted by a cell having 100 RBs (20 MHz) DL system bandwidth. The device is allocated a subband comprising 6 RBs in a part of the spectrum, outside the central 6 RBs, for unicast communication. The device regularly needs to retune to the central 6 RBs to search for synchronization signals and to perform RSRP measurements on intra-frequency neighbor cells. The MTC device thus repeatedly hops back and forth between groups of RBs (each being 6 RBs wide) within the DL bandwidth of the hosting serving cell.

When hopping within the same cell, the power level of the reference signals in the target subband (i.e., the central 6 RBs) is known from earlier operation in this part of the spectrum; hence, the device has a good idea about expected gain variation when returning to the target subband and can avoid carrying out a gain search and instead directly apply, for example, the same analog gain setting that was used for the source subband.

When operating in complex radio conditions with fading, the frequency characteristics of the radio channel may vary over the DL system bandwidth. In such instances, the larger the distance between source and target subbands the more the characteristics of the radio channel may differ. As a result, when significant fading is detected the device may apply a more conservative approach and search/adjust the gain before attempting to receive a signal in the target subband. This is because it is known from historical data that even a quite small frequency change might result in large gain changes; consequently, just using the gain setting being applied at the source (current) frequency will not work. The historical data does not directly contain which gain to use for a certain frequency, but rather indicates how much variation can be expected.

Various aspects of the herein-described technology provide advantages over conventional AGC techniques. For example, by detecting when an optimized AGC procedure can be used (or even when current gain settings can be applied "as is" for a target frequency), devices avoid unnecessarily spending time and power to arrive at gain settings.

The invention has been described with reference to particular embodiments. However, it will be readily apparent to those skilled in the art that it is possible to embody the invention in specific forms other than those of the embodiment described above. The described embodiments are merely illustrative and should not be considered restrictive in any way. The scope of the invention is further illustrated by the appended claims, rather than only by the preceding description, and all variations and equivalents which fall within the range of the claims are intended to be embraced therein.

The invention claimed is:

1. An apparatus for controlling gain of an amplifier in a receiver operating in a cellular communication system, the apparatus comprising:
    circuitry configured to select and then perform an automatic gain control algorithm from among a plurality of automatic gain control algorithms, wherein the circuitry configured to select and then perform comprises:
        circuitry configured to ascertain a current carrier frequency to which the receiver is currently tuned and a target carrier frequency to which the receiver is requested to tune;
        circuitry configured to perform a first automatic gain control algorithm to produce a target gain setting for the amplifier in response to a determination that the current carrier frequency and the target carrier frequency are not within a downlink system bandwidth of a same cell of the cellular communication system;
        circuitry configured to perform a second automatic gain control algorithm to produce the target gain setting for the amplifier in response to a determination that the current carrier frequency and the target carrier frequency are within the downlink system bandwidth of the same cell of the cellular communication system; and
    circuitry configured to use the target gain setting to initially control gain of the amplifier when the receiver is tuned to the target carrier frequency.

2. A receiver comprising
    an amplifier; and
    the apparatus of claim 1 arranged to control the amplifier.

3. A User Equipment (UE) device comprising the receiver of claim 2.

4. The User Equipment device of claim 3 wherein the User Equipment device is a Machine Type Communication (MTC) device.

* * * * *